United States Patent
Teng

(10) Patent No.: US 7,348,132 B2
(45) Date of Patent: Mar. 25, 2008

(54) LASER SENSITIVE LITHOGRAPHIC PRINTING PLATE HAVING SPECIFIC PHOTOPOLYMER COMPOSITION

(76) Inventor: Gary Ganghui Teng, 10 Kendall Dr., Northborough, MA (US) 01532

( * ) Notice: Subject to any disclaimer, the term of this patent is extended or adjusted under 35 U.S.C. 154(b) by 274 days.

(21) Appl. No.: 11/336,132

(22) Filed: Jan. 21, 2006

(65) Prior Publication Data

US 2007/0172765 A1    Jul. 26, 2007

(51) Int. Cl.
G03F 7/30 (2006.01)
G03C 5/18 (2006.01)
G03C 1/00 (2006.01)

(52) U.S. Cl. ............... 430/302; 430/271.1; 430/284.1; 430/309; 430/434; 430/435

(58) Field of Classification Search .. 430/278.1–281.1, 430/286.1, 302; 101/467
See application file for complete search history.

(56) References Cited

U.S. PATENT DOCUMENTS

| | | | |
|---|---|---|---|
| 6,014,929 A | 1/2000 | Teng | 101/456 |
| 6,423,471 B1 * | 7/2002 | Sorori et al. | 430/281.1 |
| 6,541,176 B2 | 4/2003 | Miyazaki et al. | 430/204 |
| 6,576,401 B2 | 6/2003 | Teng | 430/303 |
| 6,689,537 B2 | 2/2004 | Urano et al. | 430/273.1 |
| 6,749,995 B2 | 6/2004 | Matsumura | 430/281.1 |
| 6,902,866 B1 * | 6/2005 | Teng | 430/302 |
| 2003/0186165 A1 * | 10/2003 | Gries et al. | 430/281.1 |
| 2004/0157153 A1 | 8/2004 | Takamuki | 430/270.1 |
| 2005/0005794 A1 | 1/2005 | Inukai et al. | 101/453 |
| 2005/0204945 A1 | 9/2005 | Sonokawa | 101/463.1 |
| 2005/0227180 A1 | 10/2005 | Matsuoka et al. | 430/300 |
| 2005/0266349 A1 | 12/2005 | Van Damme et al. | 430/300 |

* cited by examiner

Primary Examiner—Dah-Wei Yuan
Assistant Examiner—Chanceity N Robinson

(57) ABSTRACT

High speed violet or ultraviolet laser sensitive lithographic printing plate comprising on a hydrophilic substrate a specific photosensitive composition is described. The photosensitive layer comprises a polymeric binder, a multifunctional (meth)acrylate monomer, a free-radical initiator, and a sensitizing dye, with specific weight ratio of the monomer to the polymer. Combination of multifunctional urethane (meth)acrylate monomer and multifunctional non-urethane (meth)acrylate monomer can be advantageously used. The plate is imagewise exposed with a violet or ultraviolet laser at a dosage of less than 300 $\mu J/cm^2$, and then developed with an aqueous developer or with ink and/or fountain solution.

28 Claims, No Drawings

LASER SENSITIVE LITHOGRAPHIC PRINTING PLATE HAVING SPECIFIC PHOTOPOLYMER COMPOSITION

FIELD OF THE INVENTION

This invention relates to lithographic printing plates. More particularly, it relates to lithographic printing plates having a photosensitive layer comprising a multifunctional (meth)acrylate monomer and a polymeric binder, suitable for image exposure with a violet or ultraviolet laser.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation. In positive-working systems, the exposed areas become more soluble and can be developed to reveal the underneath substrate. In negative-working systems, the exposed areas become hardened and the non-exposed areas can be developed to reveal the underneath substrate. Conventionally, the actinic radiation is from a lamp (usually an ultraviolet lamp) and the image pattern is generally determined by a photomask that is placed between the light source and the plate.

Laser sources have been increasingly used to imagewise expose a lithographic printing plate that is sensitized to a corresponding laser. This allows the elimination of the photomask film, reducing material, equipment and labor cost. Among the lasers useful are infrared lasers (about 830 nm or 1064 nm), FD-YAG laser (about 532 nm), violet laser (about 405 nm), and ultraviolet laser (such as about 375 nm). Violet and ultraviolet laser sensitive plates are quite attractive because of their yellow light handling capability (in contrast to red light handling for FD-YAG sensitive plate) and higher quantum efficiency (than infrared laser sensitive plate). However, the energy output of a violet or ultraviolet laser diode is much lower than that of an infrared laser diode. In order to be imaged with a violet or ultraviolet laser imager at a practical speed, a violet or ultraviolet laser sensitive plate should have a sensitivity of less than 300 $\mu J/cm^2$, preferably less than 200 $\mu J/cm^2$, more preferably less than 100 $\mu J/cm^2$, which is significantly lower than the sensitivity required for an infrared laser sensitive plate (typically 50 to 300 $mJ/cm^2$) or a conventional plate exposed with an ultraviolet lamp through a photomask (typically 50 to 300 $mJ/cm^2$).

Silver halide based violet laser sensitive plate has recently been introduced as the first lithographic printing plate suitable for imaging with violet laser, utilizing the inherently high sensitivity of silver halide. Examples include U.S. Pat. No. 6,541,176. However silver halide based plates have the disadvantages of relatively low run length and generating hazardous silver waste.

Photopolymerizable composition based (also called photopolymer) violet or ultraviolet laser sensitive plates are very attractive because of the high durability of photopolymer plates. However, because of the extremely high sensitivity requirement of the violet or ultraviolet laser sensitive plate, a commercially viable violet or ultraviolet laser sensitive photopolymer plate can not be achieved by simple addition of a laser absorbing sensitizer into a conventional photopolymer plate but will require certain specific photopolymerizable composition. The selection of the monomers is crucial in achieving a commercially viable violet or ultraviolet laser sensitive photopolymer plate.

U.S. Pat. No. 6,689,537 (Urano et al) describes some specific compositions for violet photopolymer plate, wherein the photosensitive layer comprises multifunctional (with 3 or more functional groups) urethane acrylate monomers, difunctional non-urethane acrylate monomers and a polymeric binder, and the weight ratio of the multifunctional monomers to the polymeric binders is less than 0.75.

U.S. Pat. No. 6,423,471 (Sorori et al) describes some specific compositions for violet photopolymer plate, wherein the photosensitive layer comprises a monomer and a polymeric binder at a weight ratio of 0.75.

U.S. Pat. No. 6,749,995 (Matsumura) describes some specific compositions for violet photopolymer plate, wherein the photosensitive layer comprises polyfunctional urethane acrylate monomers, trifunctionality non-urethane acrylate monomer and polymeric binder; the weight ratio of the multifunctional monomers to the polymeric binders is 1.0, and the weight ratio of the polyfunctional urethane acrylate monomer to the polymeric binder is 0.25.

U.S. Pat. App. Pub. No. 2004/0157153 (Takamuki) describes some specific compositions for violet photopolymer plate, wherein the photosensitive layer comprises a monofunctional acrylate monomer, a difunctional methacrylate monomer, a multifunctional urethane (meth)acrylate monomer, and a polymeric binder; the weight ratio of the monomers to the polymeric binder is 1.125 and the weight ratio of the multifunctional urethane monomer to the polymeric binder is 0.625.

U.S. Pat. App. Pub. No. 2003/0186165 (Gries et al) describes some specific compositions for violet photopolymer plate, wherein the photosensitive layer comprises difunctional (meth)acrylate monomer and a polymeric binder at a weight ratio of about 1.6 to 2.4. While photosensitive layers having a trifunctional non-urethane monomer and a polymeric binder at a weight ratio of about 1.63 or having a penta functional non-urethane acrylate monomer and a polymeric binder at a weight ratio of about 1.50 are also described in the patent application as comparative examples, such photosensitive layers are reported in the same patent application to give no hardening upon exposure to the violet laser.

While multifunctional monomers and higher content of the total monomers in an aqueous alkaline developable violet plate are described in the patents, there is no teaching of the weight ratio of the multifunctional monomers to the polymeric binders of higher than 1.7, or of the weight ratio of the multifunctional urethane monomers to the polymeric binders of larger than 0.8. Apparently, higher content of the multifunctional monomer might be thought to cause difficulty in development with aqueous alkaline developer, since multifunctional monomers are generally larger in size and less soluble or dispersible in aqueous developer than monofunctional or difunctional monomers.

The inventor has found, surprisingly, violet or ultraviolet laser sensitive lithographic printing plate having, between a hydrophilic substrate and a water soluble or dispersible overcoat, a photosensitive layer comprising multifunctional (meth)acrylate monomers and polymeric binders at a weight ratio of at least 1.8 or comprising multifunctional urethane (meth)acrylate monomers and polymeric binders at a weight ratio of at least 0.9, can be developed with an aqueous alkaline developer and give significantly better photospeed and press durability than plate with lower monomer-to-polymer weight ratio or with lower monomer functionality. In addition, combination of multifunctional urethane (meth)acrylate monomer and multifunctional non-urethane monomer in the photosensitive layer can give excellent photospeed and press durability as well as developability.

SUMMARY OF THE INVENTION

According to the present invention, there has been provided a method of lithographically printing images on a receiving medium, comprising in order:
(a) providing a lithographic printing plate comprising (i) a hydrophilic substrate, (ii) an oleophilic photosensitive layer comprising an alkaline soluble polymeric binder, a (meth)acrylate monomer having at least 3 (meth)acrylate groups, a free radical initiator, and a sensitizing dye, and (iii) a water soluble or dispersible overcoat; wherein the weight ratio of the monomers having at least 3 (meth)acrylate groups to the alkaline soluble polymeric binders is at least 1.8;
(b) exposing said plate with a laser having a wavelength of from 250 to 430 nm at a dosage of less than 300 µJ/cm$^2$ according to digital imaging information to cause hardening of the photosensitive layer in the exposed areas; and
(c) contacting said exposed plate with an aqueous alkaline developer having a pH of from 9.0 to 13.5 to remove the non-exposed areas of the photosensitive layer.

According to another aspect of the present invention, there has been provided a method of lithographically printing images on a receiving medium, comprising in order:
(a) providing a lithographic printing plate comprising (i) a hydrophilic substrate, (ii) an oleophilic photosensitive layer comprising a polymeric binder, a urethane (meth)acrylate monomer having at least 4 (meth)acrylate groups, a free radical initiator, and a sensitizing dye, and (iii) a water soluble or dispersible overcoat; wherein the weight ratio of said urethane monomers to the polymeric binders is at least 0.9;
(b) exposing said plate with a laser having a wavelength of from 250 to 430 nm at a dosage of less than 300 µJ/cm$^2$ according to digital imaging information to cause hardening of the photosensitive layer in the exposed areas; and
(c) contacting said exposed plate with an aqueous alkaline developer having a pH of 9.0 to 13.5 to remove the non-exposed areas of the photosensitive layer.

According to yet another aspect of the present invention, there has been provided a method of lithographically printing images on a receiving medium, comprising in order:
(a) providing a lithographic printing plate comprising (i) a hydrophilic substrate, (ii) an oleophilic photosensitive layer comprising a polymeric binder, a urethane (meth)acrylate monomer having at least 4 (meth)acrylate groups, a non-urethane (meth)acrylate monomer having at least 4 (meth)acrylate groups, a free radical initiator, and a sensitizing dye, and (iii) a water soluble or dispersible overcoat;
(b) exposing said plate with a laser having a wavelength of from 250 to 430 nm at a dosage of less than 300 µJ/cm$^2$ according to digital imaging information to cause hardening of the photosensitive layer in the exposed areas; and
(c) contacting said exposed plate with an aqueous developer or with ink and/or fountain solution to remove the non-exposed areas of the photosensitive layer.

DETAILED DESCRIPTION OF THE PREFERRED EMBODIMENTS

The substrate employed in the lithographic printing plates of this invention can be any support that provides a hydrophilic surface. Such a support may be a metal sheet, a polymer film, or a coated paper. Aluminum (including aluminum alloys) sheet is a preferred support. Particularly preferred is an aluminum support that has been grained and anodized, with or without further hydrophilic treatment. Surface graining can be achieved by mechanical graining or brushing, chemical etching, and/or AC electrochemical graining. The grained aluminum is typically treated with a basic or acid solution to remove the smut (called desmut treatment), and then subjected to an electrochemical anodization process utilizing an acid such as sulfuric acid and/or phosphoric acid. The anodization process serves to form an anodic oxide layer and is preferably controlled to create a layer of at least 0.1 g/m$^2$. The desmut is typically controlled to achieve a reflection optical density of preferably from 0.10 to 1.0, more preferably from 0.20 to 0.70, and most preferably from 0.30 to 0.50 for the final substrate.

The electrochemically grained, anodized aluminum can be further treated with a hydrophilic material to form a hydrophilic barrier layer. Suitable hydrophilic materials include metal silicate such as sodium silicate, phosphate fluoride (formed from a solution containing sodium dihydrogen phosphate and sodium fluoride, called phosphate fluoride solution), phosphoric acid, and hydrophilic polymer such as polyvinyl phosphonic acid, polyacrylamide, polyacrylic acid, polybasic organic acid, copolymers of vinyl phosphonic acid and acrylamide. Polyvinyl phosphonic acid and its copolymers are preferred polymers. The hydrophilic material can be formed on the aluminum surface by thermal or electrochemical method. By thermal method, the grained and anodized aluminum passes through or is immersed for a certain time in a solution containing the hydrophilic material at a certain temperature including elevated and room temperature. By electrochemical method, a DC or AC electricity is applied to the aluminum while passing through or immersed in the solution containing the hydrophilic material. Processes for forming a hydrophilic barrier layer on aluminum in lithographic printing plate application are well known in the art, and examples can be found in U.S. Pat. Nos. 2,714,066, 4,153,461, 4,399,021, 5,368,974, and 6,555,205.

According to the first aspect of the current invention, the photosensitive layer comprises an alkaline soluble polymeric binder, a (meth)acrylate monomer having at least 3 (meth)acrylate groups, a free radical initiator, and a sensitizing dye. A hydrogen donor compound is preferably added. The weight ratio of the monomers having at least 3 (meth)acrylate groups to the alkaline soluble polymeric binders is at least 1.8, preferably from 2.0 to 6.0, more preferably from 2.3 to 5.0, and most preferably from 2.6 to 4.0. The monomer preferably has at least 4 (meth)acrylate groups, more preferably 5 (meth)acrylate groups, and most preferably 6 (meth)acrylate groups. A non-alkaline soluble polymeric binder can be added, preferably at an amount less than the alkaline soluble polymeric binder.

According to the second aspect of the current invention, the photosensitive layer comprises a polymeric binder, a urethane (meth)acrylate monomer having at least 4 (meth)acrylate groups, a free radical initiator, and a sensitizing dye. A hydrogen donor compound is preferably added. The weight ratio for said urethane monomers to the polymeric binders is at least 0.9, preferably from 1.2 to 6.0, more preferably from 1.8 to 5.0, and most preferably from 2.4 to 4.0. The monomer preferably has at least 5 (meth)acrylate groups, and more preferably at least 6 (meth)acrylate groups. A non-urethane (meth)acrylate monomer can be added. The polymeric binder is preferably alkaline soluble.

According to the third aspect of the current invention, the photosensitive layer of this invention comprises a polymeric binder, a urethane (meth)acrylate monomer having at least 4 (meth)acrylate groups, a non-urethane (meth)acrylate monomer having at least 4 (meth)acrylate groups, a free radical initiator, and a sensitizing dye. A hydrogen donor compound is preferably added. The weight ratio of the urethane (meth)acrylate monomers to the non-urethane (meth)acrylate monomers is preferably from 0.10 to 10.0, more preferably from 0.20 to 5.0, and most preferably from 0.30 to 3.0. The weight ratio of the monomers having at least 4 (meth)acrylate groups to the polymeric binders is at least 0.5, preferably from 1.0 to 6.0, more preferably from 1.5 to 5.0, and most preferably from 2.0 to 4.0. The urethane monomer preferably has at least 5 (meth)acrylate groups, and more preferably at least 6 (meth)acrylate groups.

In the photosensitive layers of this invention (including last three paragraphs), a preferred initiator is a titanocene or hexaarylbiimidazole compound, more preferably a hexaarylbiimidazole compound; and a preferred sensitizing dye is a dialkylaminobenzophenone compound, more preferably a 4,4'-bis(dialkylamino)benzophenone compound. Preferred hydrogen donor compounds are 2-mercaptobenzoxazole, 2-mercaptobenzimidazole, 2-mercaptobenzothiazole, 3-mercapto-1,2,4-triazole, N,N-dialkyl benzoic alkyl ester, N-phenylglycine ethyl ester, and N-phenylglycine benzyl ester. Various additives, such as surfactant, colorant (dye or pigment), exposure indicating dye (such as leuco crystal violet, leucomalachite green, azobenzene, 4-phenylazodiphenylamine, and methylene blue dyes), and free radical stabilizer (such as methoxyhydroquinone) can be added. Monomers with lower (meth)acrylate functionality can be added.

In a preferred embodiment for the violet or ultraviolet laser sensitive lithographic plates of this invention, the photosensitive layer comprises a polymeric binder, a monomer having at least 3 (meth)acrylate group, a hexaarylbiimidazole or titanocene compound, a dialkylaminobenzophenone compound, and a hydrogen donor compound. The monomer-to-polymer weight ratio is at least 1.8, preferably from 2.0 to 6.0, more preferably from 2.3 to 5.0, and most preferably from 2.6 to 4.0. A hexaarylbiimidazole compound is preferred among hexaarylbiimidazole and titanocene compounds. A preferred dialkylaminobenzophenone compound is a 4,4'-bis(dialkylamino)benzophenone compound.

In another preferred embodiment for the violet or ultraviolet laser sensitive lithographic plates of this invention, the photosensitive layer comprises a polymeric binder, a urethane monomer having at least 4 (meth)acrylate group, a hexaarylbiimidazole or titanocene compound, a dialkylaminobenzophenone compound, and a hydrogen donor compound. The monomer-to-polymer weight ratio is at least 0.9, preferably from 1.2 to 6.0, more preferably from 1.8 to 5.0, and most preferably from 2.4 to 4.0. A hexaarylbiimidazole compound is preferred among hexaarylbiimidazole and titanocene compounds. A preferred dialkylaminobenzophenone compound is a 4,4'-bis(dialkylamino)benzophenone compound. A non-urethane (meth)acrylate monomer can be added.

In yet another preferred embodiment for the violet or ultraviolet laser sensitive lithographic plates of this invention, the photosensitive layer comprises a polymeric binder, a urethane monomer having at least 4 (meth)acrylate group, a non-urethane monomer having at least 4 (meth)acrylate groups, a hexaarylbiimidazole or titanocene compound, a dialkylaminobenzophenone compound, and a hydrogen donor compound. The weight ratio of the urethane (meth)acrylate monomer to the non-urethane (meth)acrylate monomer is preferably from 0.10 to 10.0, more preferably from 0.20 to 5.0, and most preferably from 0.30 to 3.0. The weight ratio for said monomers to the polymeric binders is preferably at least 0.5, more preferably from 1.0 to 6.0, even more preferably from 1.5 to 5.0, and most preferably from 2.0 to 4.0. A hexaarylbiimidazole compound is preferred among hexaarylbiimidazole and titanocene compounds. A preferred dialkylaminobenzophenone compound is a 4,4'-bis(dialkylamino)benzophenone compound.

In this patent, the term monomer includes both monomer and oligomer, and the term (meth)acrylate includes both acrylate and methacrylate (A monomer means a monomer or an oligomer, and a (meth)acrylate monomer means an acrylate monomer, a methacrylate monomer, or a monomer with both acrylate and methacrylate groups.). The term monomer to polymer weight ratio means the weight ratio of all the specific monomers to all the polymeric binders (which are solid film-forming polymers); liquid polymer such as nonionic surfactant is not considered polymeric binder and is not included in the monomer to polymer weight ratio calculation. The term "comprises a . . . " means "comprises at least one . . . "; for example, the term "comprising a monomer" means "comprising at least one monomer."

The photosensitive layer of this invention can be solid or semisolid at 25° C. In one embodiment, semisolid photosensitive layer is preferably used to achieve fast photospeed, and/or developability with ink and/or fountain solution or with an aqueous developer. Here the term semisolid photosensitive layer is defined as a photosensitive layer which, when coated on a flat and smooth surface at a thickness of at least 1 micron, is able to form fingerprints when pressed with a finger at a force (or weight) of 2 kg and is tacky to touch by fingers at 25° C.

Polymeric binder for the photosensitive layer of this invention can be any solid film-forming polymer. The polymer may or may not have (meth)acrylate groups or other ethylenic groups (such as allyl groups). Examples of suitable polymers include (meth)acrylic polymers and copolymers (such as polybutylmethacrylate, polyethylmethacrylate, polymethylmethacrylate, polymethylacrylate, butylmethacrylate/methylmethacrylate copolymer, methylmethacrylate/methylmethacrylic acid copolymer, polyallylmethacrylate, and allylmethacrylate/methacrylic acid copolymer), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, and polyurethane binder. The alkaline soluble polymeric binder suitable for the alkaline developable photosensitive layer of this invention can be any polymeric binder that is soluble in an aqueous alkaline solution having a pH of from 9.0 to 13.5, preferably from 10.0 to 13.0. Preferred alkaline soluble polymers are polymers with carboxylic acid groups. The acid number is preferably from 20 to 300, more preferably from 40 to 200, and most preferably from 60 to 150 mg KOH/g polymer. (The acid number is defined as the amount in mg of KOH required to neutralize 1 g of the polymer.) The polymeric binder suitable for the photosensitive layer of this invention has a weight average molecular weight of at least 5,000, preferably from 10,000 to 1,000,000, more preferably from 20,000 to 500,000, and most preferably from 50,000 to 200,000 Dalton.

Suitable free-radical polymerizable monomers (including oligomers) include, for example, multifunctional acrylate monomers or oligomers, such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate; and oligomeric amine diacrylates. The monomers can be urethane (meth)acrylate, or non-urethane (meth)acrylate. Combination of both urethane (meth)acrylate and non-urethane (meth)acrylate monomers can be used. The monomers, preferably has at least 3 (meth)acrylate groups, more preferably at least 4 (meth)acrylate groups, even more preferably at least 5 (meth)acrylate groups, and most preferably at least 6 (meth)acrylate groups. However, monofunctional or difunctional (meth)acrylate monomer can be added into the photosensitive layer having multifunctional (meth)acrylate monomers; the total amount of such monofunctional or difunctional monomers is preferably less than 50% by weight of the total monomers, more preferably less than 30%, and most preferably less than 10%. Acrylate monomer is preferred over methacrylate monomer because of the faster photospeed of acrylate group over methacrylate group. The monomer has a molecular weight of less than 4,000, preferably from 100 to 3,000, more preferably from 200 to 2,000, and most preferably from 300 to 1,500 Dalton.

Urethane (meth)acrylate monomers include any compounds having at least one urethane linkage (—NHCOO—) and at least one (meth)acrylate group. Preferred urethane (metha)acrylate monomers are those with at least 3 (meth)acrylate groups, more preferably at least 4 (meth)acrylate groups, even more preferably at least 5 (meth)acrylate groups, and most preferably at least 6 (meth)acrylate groups. Urethane (meth)acrylate monomer is usually formed by reacting a compound having at least one isocyanate group with a (meth)acrylate compound having a hydroxy group. Urethane monomer with 2 or more (meth)acrylate groups are usually formed from a compound having one or more isocyanate groups and a (meth)acrylate compound having a hydroxy group and one or more (meth)acrylate groups. For example, a tetrafunctional urethane (meth)acrylate monomer can be formed from a compound having one hydroxy group and 2 (meth)acrylate groups with a bifunctional isocyanate compound. Suitable isocyanate compounds include, for example, aromatic diisocyanate such as p-phenylene diisocyanate, 2,4-tolylene diisocyanate, 2,6-tolylene diisocyanate, 4,4'-diphenylmethane diisocyanate, naphthalene-1,5-diisocyanate and tolydine diisocyanate; aliphatic diisocyanate such as hexamethylene diisocyanate, lysinemethyl ester diisocyanate, 2,4,4-trimethylhexamethylene diisocyanate and dimer acid diisocyanate; alicyclic diisocyanate such as isophorone diisocyanate, and 4,4'-methylenebis(cyclohexylisocyanate); aliphatic diisocyanate having an aromatic ring, such as xylylene diisocyanate; triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanate phenylmethane) and tris(isocyanatephenyl)thiophosphate; and polyisocyanate formed from condensation of three or more diisocyanate compounds such as 2,4-tolylene diisocyanate isocyanurate trimer, 2,4-tolylene diisocyanate-trimethylolpropane adduct, 1,6-hexanediisocyante isocyanurate trimer. Suitable (meth)acrylate compounds with one hydroxy group include pentaerythritol tri(meth)acrylate, dipentaerythritol penta(meth)acrylate, ditrimethylolpropane tri(meth)acrylate and pentaerythritol di(meth)acrylate monostearate. Various urethane (meth) acrylate monomers are described in U.S. Pat. No. 6,232,038 and U.S. Pat. Pub. No. 2002/0018962, and can be used as the urethane (meth)acrylate monomers of this instant invention. Among the urethane (meth)acrylate monomers, urethane acrylate monomer is preferred. Either aromatic urethane (meth)acrylate monomer (which contains at least one aromatic group in the molecule) or aliphatic urethane (meth) acrylate monomer (which does not contain any aromatic group in the molecule) or both can be used in a photosensitive layer of this invention.

Suitable non-urethane (meth)acrylate monomers can be any (meth)acrylate monomers without urethane linkage (—NHCOO—) in the molecule. Suitable non-urethane (meth)acrylate monomers with 3 or more (meth)acrylate groups include any non-urethane (meth)acrylate monomer with 3 or more (meth)acrylate groups, such as trimethylolpropane triacrylate, pentaerythritol tetra(meth)acrylate, dipentaerythritol penta(meth)acrylate, dipentaerythritol hexa(meth)acrylate, di(trimethylolpropane) tetra(meth)acrylate. Among the non-urethane (meth)acrylate monomers, non-urethane acrylate monomer is preferred.

The free-radical initiators useful in this instant invention can be any compound capable of generating free radicals to cause the polymerization of the (meth)acrylate monomer in the presence of a violet or ultraviolet laser sensitizing dye upon exposure to a violet or ultraviolet laser at a dosage of from 1 to 300 µJ/cm$^2$. Suitable free-radical initiators include, for example, onium salts such as diaryliodonium hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl) phenyliodonium hexafluoroantimonate, bis(4-t-butylphenyl) iodonium hexafluorophosphate, triarylsulfonium hexafluorophosphate, triarylsulfonium p-toluenesulfonate, (3-phenylpropan-2-onyl) triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and the borate salts as described in U.S. Pat. Nos. 6,232,038 and 6,218,076; haloalkyl substituted s-triazines such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354; hexaarylbiimidazole compounds such as 2,2'-bis(2-chlorophenyl)-4,4',5,5'-tetraphenyl-1,1'-biimidazole, 2,2'-bis(2- ethoxyphenyl)-4,4',5,5'-tetraphenyl-1,1'-biimidazole, and 2-(1-naphthyl)-4,5-diphenyl-1,2'-biimidazole; and titanocene compounds such as bis(η⁹-2,4-cyclopentadien-1-yl) bis[2,6-difluoro-3-(1H-pyrrol-1-yl)phenyl] titanium. The hexaarylbiimidazole compounds and titanocene compounds are preferred initiators, and hexaarylbiimidazole compounds are more preferred. One or more initiators can be added in a photosensitive layer. The initiator is added in the photosensitive layer preferably at 0.5 to 40% by weight of the photosensitive layer, more preferably at 2 to 30%, and most preferably at 5 to 20%.

The hexaarylbiimidazole compound is a biimidazole compound having three aryl groups on each of the two imidazole moieties. Examples of hexaarylbiimidazole compounds include 2,2'-bis(o-chlorophenyl)-4,4',5,5'-tetraphenylbiimidazole, 2,2'-bis(o-chlorophenyl)-4,4',5,5'-tetra(p-methoxyphenyl)biimidazole, 2,2'-bis(o-chlorophenyl)-4,4',5,5'-tetra(p-methylphenyl)biimidazole, 2,2'-bis(o-chlorophenyl)-4,4',5,5'-tetra(p-ethoxycarbonylphenyl) biimidazole, 2,2'-bis(o-chlorophenyl)-4,4',5,5'-tetra(p-fluorophenyl)biimidazole, 2,2'-bis(o-bromophenyl)-4,4',5,5'-tetra(p-iodophenyl)biimidazole, 2,2'-bis(o-chlorophenyl)-4,4',5,5'-tetra(p-chloronaphthyl)biimidazole, 2,2'-bis(o-chlorophenyl)-4,4',5,5'-tetra(p-chlorophenyl)biimidazole, 2,2'-bis(o-bromophenyl)-4,4',5,5'-tetra(p-chlor-p-methoxyphenyl)biimidazole, 2,2'-bis(o-chlorophenyl)-4,4',5,5'-tetra (o,p-dichlorophenyl)biimidazole, 2,2'-bis(o-chlorophenyl)-4,4',5,5'-tetra(o,p-dibromophenyl)biimidazole, 2,2'-bis(o-bromophenyl)-4,4',5,5'-tetra(o,p-dichlorophenyl) biimidazole, or 2,2'-bis(o,p-dichlorophenyl)-4,4',5,5'-tetra (o,p-dichlorophenyl)biimidazole. Of these compounds, preferred is a hexaphenylbiimidazole compound, particularly preferred is one which has the ortho-positions of the benzene rings at the 2,2'-positions on the imidazole rings replaced with halogen, more preferred is one having benzene rings at the 4,4',5,5'-positions on the imidazole rings not replaced, replaced with halogen or replaced with alkoxycarbonyl, and most preferred is a combination of embodiments of the two hexaphenylbiimidazole compounds.

Suitable titanocene compounds include titanium compounds having a dicyclopentadienyl structure and a biphenyl structure, such as dicyclopentadienyl titanium dichloride, dicyclopentadienyl titanium bisphenyl, dicyclopentadienyltitanium bis(2,4-difluorophenyl), dicyclopentadienyl titanium bis(2,6-difluorophenyl), dicyclopentadienyl titanium bis(2,4,6-trifluorophenyl), dicyclopentadienyl titanium bis(2,3,5,6-tetrafluorophenyl), dicyclopentadienyl titanium bis(2,3,4,5,6-pentafluorophenyl), di(methylcyclopentadienyl) titanium bis(2,6-difluorophenyl), di(methylcyclopentadienyl) titanium bis(2,3,4,5,6-pentafluorophenyl), and dicyclopentadienyl titanium bis[2,6-difluoro-3-(1-pyrrolyl)phenyl]. A preferred compound is one having the o-positions of the biphenyl ring replaced with a halogen atom.

Violet or ultraviolet laser sensitizing dyes useful in the violet laser sensitive photosensitive layer of this invention include any dyes capable of absorbing the violet or ultraviolet laser (about 250 to 430 nm) at a dosage of less than 300 μJ/cm² to activate the free radical initiator to cause polymerization of the monomers. Suitable violet or ultraviolet laser sensitive dyes include, for example, cyanine dyes (including polymethine dyes); chromanone compounds such as 4-diethylaminobenzilidene chromanone; dialkylaminobenzene compounds such as ethyl 4-dimethylaminobenzoate and dialkylaminobenzene; dialkylaminobenzophenone compounds such as 4,4'-bis(dimethylamino) benzophenone, 4,4'-bis(diethylamino)benzophenone, 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5-bis(p-diethylaminophenyl) 1,3,4-oxazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl)1,3,4-thiadiazole, (p-dimethylaminophenyl)pyridine, (p-diethylaminophenyl) pyridine, 2-(p-dimethylaminophenyl)quinoline, 2-(p-diethylaminophenyl)quinoline, 2-(p-dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Dialkylaminobenzene compounds (including bis(dialkylamino)benzophenone compounds) are particularly suitable for ultraviolet laser sensitive plate. Bis(dialkylamino)benzophenone compounds are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention. The violet laser sensitizing dye is added in the photosensitive layer preferably at 0.1 to 20% by weight of the photosensitive layer, more preferably 0.5 to 15%, and most preferably 1 to 10%.

The photosensitive composition of the present invention preferably contains one or more hydrogen donor compound as a polymerization accelerator. Examples of the hydrogen donor compound include compounds having a mercapto group such as 2-mercaptobenzothiazole, 2-mercaptobenzimidazole, 2-mercaptobenzoxazole and 3-mercapto-1,2,4-triazole, N,N-dialkyl benzoic alkyl ester, N-aryl-α-amino acids, their salts and esters such as N-phenylglycine, salts of N-phenylglycine, and alkyl esters of N-phenylglycine such as N-phenylglycine ethyl ester and N-phenylglycine benzyl ester.

The photosensitive layer developable with an aqueous alkaline developer must be soluble or dispersible in an aqueous developer in the non-hardened areas. The photosensitive layer preferably comprises at least one alkaline soluble polymer.

The photosensitive layer suitable for on-press developable plate of this invention must be soluble or dispersible in ink and/or fountain solution and can be developed off on a lithographic press with ink and/or fountain solution.

Various surfactants may be added into the photosensitive layer to allow or enhance the on-press developability with ink and/or fountain solution or developability with an aqueous solution. Both polymeric and small molecule surfactants can be used. However, it is preferred that the surfactant has low or no volatility so that it will not evaporate from the photosensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g photosensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 30% by weight of the photosensitive layer, more preferably from 0.5 to 20%, and most preferably from 1 to 15%.

For plates with rough and/or porous surface capable of mechanical interlocking with a coating deposited thereon, a thin water soluble interlayer may be deposited between the substrate and the photosensitive layer. Here the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is the preferred water-soluble polymer. Usually pure water-soluble polymer is coated. However, one or more surfactant and other additives may be added. The water-soluble polymer is generally coated from an aqueous solution with water as the only solvent. A water-soluble organic solvent, preferably an alcohol such as ethanol or isopropanol, can be added into the water-soluble polymer aqueous coating solution to improve the coatability. The alcohol is preferably added at less than 40% by weight of the solution, more preferably at less than 20%, and most preferably at less than 10%. The releasable interlayer preferably has an average coverage of 1 to 200 mg/m$^2$, more preferably 2 to 100 mg/m$^2$, and most preferably 4 to 40 mg/m$^2$. The substrate preferably has an average surface roughness Ra of 0.2 to 2.0 microns, and more preferably 0.4 to 1.0 microns.

The water soluble or dispersible overcoat preferably comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) may also be used. Polyvinyl alcohol is a preferred water-soluble polymer. Various additives, such as surfactant, wetting agent, defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic emulsion or dispersion may be added into the overcoat to, for example, reduce the tackiness or moisture sensitivity of the plate. For plate developable with a regular liquid developer, the overcoat preferably has a coverage of from 0.1 to 5.0 g/m$^2$, more preferably from 0.5 to 3.0 g/m$^2$, and most preferably from 1.0 to 2.0 g/m$^2$. For on-process developable plate, the overcoat preferably has a coverage of from 0.001 to 3.0 g/m$^2$, more preferably from 0.01 to 1.0 g/m$^2$, and most preferably from 0.05 to 0.5 g/m$^2$.

For conventional wet press, usually fountain solution is applied (to contact the plate) first, followed by contacting with ink roller. For press with integrated inking/dampening system, the ink and fountain solution are emulsified by various press rollers before being transferred to the plate as emulsion of ink and fountain solution. However, in this invention, the ink and fountain solution may be applied at any combination or sequence, as needed for the plate. There is no particular limitation. The recently introduced single fluid ink that can be used for printing wet lithographic plate without the use of fountain solution, as described in for example U.S. Pat. No. 6,140,392, can also be used for the on-press development and printing of the on-press developable plate as well as for the printing of the aqueous developable plate of this invention.

The alkaline aqueous developer is an aqueous solution comprising 60-99% by weight of water, and 0.2 to 20%, preferably 0.5 to 10%, by weight of alkaline compound and having a pH of at least 9.0, preferably from 9.5 to 13.5, more preferably from 10.0 to 13.0, and most preferably from 10.5 to 12.5. More than one alkaline compound can be used. Suitable alkaline compounds include inorganic alkaline compounds such as potassium silicate, sodium silicate, potassium hydroxide, and sodium hydroxide, and organic amine compounds such as triethylamine, diethylamine, triethanolamine, and diethanolamine. One or more surfactants (ionic or nonionic or both) are preferably added. Various additives such as dye or pigment, defoamer, and hydrophilization agent can be added. One or more organic solvents, preferably water soluble organic solvents, can be added at 0.1 to 20% by weight of the developer. Preferably, no organic solvent is added.

The non-alkaline aqueous developer is an aqueous solution comprising 60-99% by weight of water and 0.5 to 40% by weight of an alcohol solvent and having a pH of 3.0 to 8.9. The alcohol solvent is defined as a water-soluble liquid organic compound having at least one hydroxyl group. The alcohol solvent must be soluble or capable of forming stable emulsion in water at the added concentration. Liquid alkyl alcohol (including arylalky alcohol) and its liquid derivatives are preferred alcohol solvents. Alcohol solvents useful for the developer of this invention include, for example, various liquid water-soluble alkyl alcohol, arylalkyl alcohol, alkoxyalkyl alcohol, arylalkoxyalkyl alcohol, aroxyalkyl alcohol, oxydialkanol, and alkyl lactate. Other functional group, such as ester, ether, epoxy, or ethylenic group, may be attached to the alkyl or aryl group. Examples of useful alcohol solvents are benzyl alcohol, phenethyl alcohol, isopropyl alcohol, 1-propyl alcohol, ethyl alcohol, butyl alcohol, ethyl lactate, propyl lactate, butyl lactate, methoxyethanol, ethoxyethanol, propoxyethanol, butoxyethanol, methoxypropanol, ethoxypropanol, propoxypropanol, butoxypropanol, diethylene glycol (2,2'-oxydiethanol), phenoxyethanol, and phenoxypropanol. For the alcohols with isomers, all liquid isomers can be used. Benzyl alcohol is a particularly useful alcohol solvent. Usually one alcohol solvent is used in the developer. However, two or more alcohol solvents can also be used in the same developer. The alcohol solvent is added preferably at 1 to 30% by weight of the developer and more preferably at 2 to 20%. The non-alkaline aqueous developer preferably has a pH of 3.0 to 8.9, more preferably 5.0 to 8.5, most preferably 6.0 to 8.0. While a pH of close to neutral (pH of about 7.0) is preferred, the pH may be slightly to moderately basic or acidic due to addition of certain additives for improving, for example, the hydrophilicity of the substrate. For example, phosphoric acid or citric acid may be added to improve the hydrophilicity of certain substrate; and small amount of diethanolamine may be added to adjust the pH to slightly basic to improve the hydrophilicity of certain substrate.

Various surfactants can be added into the developer to, for example, help the wetting of the developer on the plate, improve the developability, reduce solid residue in the developer, and condition the bared substrate. Either ionic or nonionic water-soluble surfactant or both can be used. Examples of useful surfactants include polyethylene glycol, polypropylene glycol, and copolymer of ethylene glycol and propylene glycol, polysiloxane surfactants, ionic perfluorocarbon surfactants, nonionic perfluorocarbon surfactants, sodium dioctylsulfosuccinate, sodium dodecylbenzenesulfonate, sodium butylnaphthalenesulfate, sodium alkylnaphthalenesulfate, sodium cumenesulfonate, and ammonium laurylsulfate. The surfactant is preferably added at from 0.01 to 20% by weight of the developer, more preferably from 0.1 to 10%, and most preferably from 1 to 5%. Various other additives, such as defoamer, bactericide, dye, and substrate conditioner (such as gum arabic, and maltodextrin), can be added. Certain salts, such as sodium chloride, potassium phosphate and ammonium sulfite, may be added to, for example, improve the hydrophilicity of the bared substrate.

The laser exposed plate can be directly developed with an aqueous solution or with ink and/or fountain solution. Alternatively, the laser exposed plate can be overall heated to an elevated temperature (such as from 50 to 200° C. for 1 to 600 seconds) to further harden the exposed areas before development. Such a heating process is also called preheat. The plate can be heated by any method that does not cause hardening of the photosensitive layer in the non-exposed areas. Suitable heating method include, for example, hot air, contacting with a heated material such as a metal plate, or applying a radiation with a wavelength of at least 550 nm such as an infrared radiation.

Violet or ultraviolet lasers useful for the imagewise exposure of the lithographic printing plates of this invention include any laser having a wavelength of from 250 to 430 nm. Examples of such lasers include violet diode laser of about 405 nm, ultraviolet laser of about 375 nm, and ultraviolet LEDs. Violet laser diode is especially useful because of its small size and relatively lower cost. Laser diodes are preferred ultraviolet lasers. The exposure dosage is preferably less than to 300 $\mu J/cm^2$, more preferably from 1 to 200 $\mu J/cm^2$, and most preferably from 5 to 100 $\mu J/cm^2$, depending on the sensitivity of the photosensitive layer.

Laser imaging devices are currently widely available commercially. Any device can be used which provides imagewise laser exposure according to digital imaging information. Commonly used imaging devices include flatbed imager, internal drum imager, and external drum imager, all of which can be used for the imagewise laser exposure in this invention.

The on-press developable plate is usually exposed on an exposure device, and then mounted on press to develop with ink and/or fountain solution and then print out regular printed sheets. However, the plate can also be exposed on a printing press (such as by mounting on the plate cylinder or sliding through a flatbed imager mounted on the press), and the exposed plate can be directly developed on press with ink and/or fountain solution and then print out regular printed sheets. The ink and/or fountain solution-solubilized or dispersed photosensitive layer and/or overcoat can be mixed into the ink and/or the fountain solution on the rollers, and/or can be transferred to the blanket and then the receiving medium (such as paper). The fountain solution roller is engaged (to the plate cylinder as for conventional inking system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium (such as paper). Good quality prints should be obtained preferably under 40 initial impressions, more preferably under 20 impressions, and most preferably under 5 impressions. The plate may be rinsed or applied with an aqueous solution, including water and fountain solution, to remove the water soluble or dispersible overcoat and/or to dampen without developing the plate, after imagewise exposure and before on-press development with ink and/or fountain solution.

The laser exposure and development is preferably performed under a safe light which does not have radiation below a certain cutoff wavelength (such as an orange light with a cutoff wavelength of 550 nm or a yellow light with a cutoff wavelength of 450 rim), or in a light-tight box. The developed plate can be handled under any light, including white light. Alternatively, the laser exposed plate can be treated with a deactivating agent to deactivate the photosensitive layer so that the plate can be handled under white light before and during development, as described in U.S. patent application Ser. 11/266,817, the entire disclosure of which is hereby incorporated by reference.

The laser exposed plate can be directly developed with an aqueous solution or with ink and/or fountain solution. Alternatively, the laser exposed plate can be rinsed with water or an aqueous solution to remove the overcoat without developing the photosensitive layer before development.

The laser exposed on-press developable plate (with or without preheat) can be applied with a deactivating agent to deactivate the photosensitive layer before development, preventing any hardening of the photosensitive layer in the non-exposed areas and allowing handling of the plate under regular office light before and during on-press development. Such a deactivating agent is described in U.S. patent application Ser. 11/266,817, the entire disclosure of which is hereby incorporated by reference.

The invention is further illustrated by the following non-limiting examples of its practice.

EXAMPLES 1-10

Ten sheets of electrochemically grained, anodized and polyvinylphosphonic acid treated aluminum substrates were coated with the photosensitive layer formulations PS-1 to PS-10 (as listed in Table 1), respectively, with a #6 Mayer rod, followed by hot air blow drying and baking in an oven at 90° C. for 2 min.

TABLE 1

| Component | (all values are by weight) | | | | | | | | | |
| --- | --- | --- | --- | --- | --- | --- | --- | --- | --- | --- |
| | PS-1 | PS-2 | PS-3 | PS-4 | PS-5 | PS-6 | PS-7 | PS-8 | PS-9 | PS-10 |
| Carboset 527 (Polymer with acid number of 80, from B. F. Goodrich) | 2.69 | 2.69 | 2.69 | 2.69 | 2.69 | 2.69 | 2.69 | 4.56 | 4.56 | 4.56 |

TABLE 1-continued (all values are by weight)

| Component | PS-1 | PS-2 | PS-3 | PS-4 | PS-5 | PS-6 | PS-7 | PS-8 | PS-9 | PS-10 |
|---|---|---|---|---|---|---|---|---|---|---|
| Sartomer CN975 (Hexafunctional urethane acrylate monomer from Sartomer Company) | 6.43 | | | | 3.22 | 3.22 | 3.22 | 4.56 | | |
| Sartomer SR-399 (Pentafunctional non-urethane acrylate monomer from Sartomer Company) | | 6.43 | | | 3.22 | | | | 4.56 | |
| Sartomer SR-295 (Tetrafunctional non-urethane acrylate monomer from Sartomer Company) | | | 6.43 | | | 3.22 | | | | |
| Sartomer SR-349 (Difunctional non-urethane acrylate monomer from Sartomer Company) | | | | 6.43 | | | 3.22 | | | 4.56 |
| Renol Blue B2G-HW (60 parts blue pigment dispersed in 40 parts polyvinylbutyral from Ciba-Geigy) | 0.57 | 0.57 | 0.57 | 0.57 | 0.57 | 0.57 | 0.57 | 0.57 | 0.57 | 0.57 |
| Pluronic L43 (Nonionic surfactant from BASF) | 0.14 | 0.14 | 0.14 | 0.14 | 0.14 | 0.14 | 0.14 | 0.14 | 0.14 | 0.14 |
| 2,2'-Bis(2-chlorophenyl)-4,4',5,5'-tetraphenyl-1,1'-biimidazole | 1.21 | 1.21 | 1.21 | 1.21 | 1.21 | 1.21 | 1.21 | 1.21 | 1.21 | 1.21 |
| 4,4'-Bis(diethylamino) benzophenone | 0.72 | 0.72 | 0.72 | 0.72 | 0.72 | 0.72 | 0.72 | 0.72 | 0.72 | 0.72 |
| 2-Mercaptobenzoxazole | 0.24 | 0.24 | 0.24 | 0.24 | 0.24 | 0.24 | 0.24 | 0.24 | 0.24 | 0.24 |
| 1-Methoxy-2-propanol | 61.60 | 61.60 | 61.60 | 61.60 | 61.60 | 61.60 | 61.60 | 61.60 | 61.60 | 61.60 |
| 2-Butanone | 26.40 | 26.40 | 26.40 | 26.40 | 26.40 | 26.40 | 26.40 | 26.40 | 26.40 | 26.40 |
| Monomer to polymeric binder weight ratio | 2.20 | 2.20 | 2.20 | 2.20 | 2.20 | 2.20 | 2.20 | 0.95 | 0.95 | 0.95 |
| Multifunctional monomer to polymeric binder weight ratio | 2.20 | 2.20 | 2.20 | 0.00 | 2.20 | 2.20 | 1.10 | 0.95 | 0.95 | 0.00 |
| Multifunctional monomer to alkaline soluble polymeric binder weight ratio | 2.39 | 2.39 | 2.39 | 0.00 | 2.39 | 2.39 | 1.19 | 1.00 | 1.00 | 0.00 |

Each of the photosensitive layer coated plates was further coated with a water-soluble overcoat OC-1 using a #6 Mayer rod, followed by hot air blow drying and baking in an oven at 90° C. for 2 min. The above coating and drying were performed under red light and the plates were kept in a light-tight box before development.

OC-1

| Component | Weight ratios |
|---|---|
| Airvol 203 (Polyvinyl alcohol from Air Products) | 15.0 |
| Triton X-100 (Surfactant from Union Carbide) | 0.20 |
| Water | 85.0 |

The above coated plates (Plates #1 to #10, with PS-1 to PS-10, respectively) were exposed with a violet laser imager equipped with a 60 mw laser diode emitting at about 405 nm (MAKO 8 from ECRM) at a dosage of 65 µJ/cm². The exposed plates were developed with an alkaline aqueous developer containing 2.0% by weight of potassium silicate and 3.0% by weight of a nonionic surfactant, and rinsed with water. The laser exposure was performed under an orange light (with a cut off wavelength of 550 nm—no light below 550 nm), and the development was performed under a red light. The developed plates were evaluated for the imaging pattern and background, with the results listed in Table 2.

TABLE 2

| | Plate | | | | | | | | | |
|---|---|---|---|---|---|---|---|---|---|---|
| | #1 | #2 | #3 | #4 | #5 | #6 | #7 | #8 | #9 | #10 |
| Photosensitive layer | PS-1 | PS-2 | PS-3 | PS-4 | PS-5 | PS-6 | PS-7 | PS-8 | PS-9 | PS-10 |
| Imaging pattern | Good | Good | Good | Wash off | Good | Good | Fair | Fair | Poor | Wash off |
| Background | Clean | Clean | Clean | Clean | Clean | Clean | Clean | Clean | Clean | Clean |
| Highlight resolution | 2% | 2% | 2% | Wash off | 2% | 2% | 20% | 20% | >20% | Wash off |

I claim:

1. A method of processing a lithographic printing plate comprising in order:
   (a) providing a lithographic printing plate comprising (i) a hydrophilic substrate, (ii) an oleophilic photosensitive layer comprising a polymeric binder, a urethane (meth) acrylate monomer having at least 4 (meth)acrylate groups, a non-urethane (meth)acrylate monomer having at least 4 (meth)acrylate groups, a free radical initiator, and a sensitizing dye, and (iii) a water soluble or dispersible overcoat;
   (b) exposing said plate with a laser having a wavelength of from 250 to 430 nm at a dosage of less than 300 $\mu J/cm^2$ according to digital imaging information to cause hardening of the photosensitive layer in the exposed areas; and
   (c) contacting said exposed plate with an aqueous developer or with ink and/or fountain solution to remove the non-exposed areas of the photosensitive layer.

2. The method of claim 1 wherein the weight ratio of the urethane (meth)acrylate monomer to the non-urethane (meth)acrylate monomer is from 0.10 to 10.0.

3. The method of claim 1 wherein the weight ratio of the urethane (meth)acrylate monomer to the non-urethane (meth)acrylate monomer is from 0.30 to 3.0.

4. The method of claim 1 wherein said photosensitive layer has a weight ratio of all the monomers having at least 4 (meth)acrylate groups to all the polymeric binders of at least 0.9.

5. The method of claim 1 wherein said photosensitive layer has a weight ratio of all the monomers having at least 4 (meth)acrylate groups to all the polymeric binders of at least 1.8.

6. The method of claim 1 wherein said photosensitive layer has a weight ratio of all the monomers having at least 4 (meth)acrylate groups to all the polymeric binders of at least 2.4.

7. The method of claim 1 wherein said polymeric binder is soluble in an aqueous alkaline solution and said plate is developed with an alkaline aqueous developer.

8. The method of claim 1 wherein said photosensitive layer is soluble or dispersible in ink and/or fountain solution and said plate is developed on press with ink and/or fountain solution.

9. The method of claim 1 wherein said plate is heated to an elevated temperature of 50 to 200° C. for 1 to 600 seconds after said laser exposure (step b) and before said development (step c).

10. The method of claim 1 wherein said photosensitive layer is soluble or dispersible in ink and/or fountain solution, and said plate is applied with a deactivating agent after said laser exposure (step b) and before said development (step c) with ink and/or fountain solution.

11. The method of claim 1 wherein said photosensitive layer is soluble or dispersible in ink and/or fountain solution, and said plate is heated to an elevated temperature of 50 to 200° C. for 1 to 600 seconds and then applied with a deactivating agent after said laser exposure (step b) and before said development (step c) with ink and/or fountain solution.

12. The method of claim 1 wherein said free radical initiator is a hexaarylbiimidazole compound, said sensitizing dye is a 4,4'-bis(dialkylamino)benzophenone compound, and said photosensitive layer further includes a hydrogen donor compound.

13. The method of claim 1 wherein said photosensitive layer is soluble or dispersible in ink and/or fountain solution and said plate is imagewise exposed with said laser while mounted on the plate cylinder of a lithographic printing press and then on-press developed with ink and/or fountain solution.

14. The method of claim 1 wherein said urethane monomer has at least 5 (meth)acrylate groups.

15. The method of claim 1 wherein said urethane monomer has at least 6 (meth)acrylate groups.

16. The method of claim 1 wherein said photosensitive layer further comprises a hydrogen donor compound.

17. The method of claim 1 wherein said free radical initiator is a hexaarylbiimidazole compound or a titanocene compound.

18. The method of claim 1 wherein said free radical initiator is a hexaarylbiimidazole compound.

19. The method of claim 1 wherein said plate is exposed with said laser at a dosage of from 5 to 100 $\mu J/cm_2$.

20. A method of processing a lithographic printing plate comprising in order:
   (a) providing a lithographic printing plate comprising (i) a hydrophilic substrate, (ii) an oleophilic photosensitive layer comprising a polymeric binder, a urethane monomer having at least 4 (meth)acrylate group, a non-urethane monomer having at least 4 (meth)acrylate groups a hexaarylbiimidazole compound, a dialkylaminobenzophenone compound, and a hydrogen donor compound, and (iii) a water soluble or dispersible overcoat;
   (b) exposing said plate with a laser having a wavelength of from 250 to 430 nm at a dosage of less than 300 $\mu J/cm_2$ according to digital imaging information to cause hardening of the photosensitive layer in the exposed areas; and
   (c) contacting said exposed plate with an aqueous developer or with ink and/or fountain solution to remove the non-exposed areas of the photosensitive layer.

21. The method of claim 20 wherein the weight ratio of the urethane (meth)acrylate monomer to the non-urethane (meth)acrylate monomer is from 0.10 to 10.0.

22. The method of claim 20 wherein the weight ratio of the urethane (meth)acrylate monomer to the non-urethane (meth)acrylate monomer is from 0.20 to 5.0.

23. The method of claim 20 wherein said photosensitive layer has a weight ratio of all the monomers having at least 4 (meth)acrylate groups to all the polymeric binders of from 1.0 to 6.0.

24. The method of claim 20 wherein said photosensitive layer has a weight ratio of all the monomers having at least 4 (meth)acrylate groups to all the polymeric binders of from 1.5 to 5.0.

25. The method of claim 20 wherein said photosensitive layer has a weight ratio of all the monomers having at least 4 (meth)acrylate groups to all the polymeric binders of from 2.0 to 4.0.

26. The method of claim 20 wherein said polymeric binder is soluble in an aqueous alkaline solution and said plate is developed with an alkaline aqueous developer.

27. The method of claim 20 wherein said photosensitive layer is soluble or dispersible in ink and/or fountain solution and said plate is developed on press with ink and/or fountain solution.

28. The method of claim 20 wherein said plate is heated to an elevated temperature of 50 to 200° C. for 1 to 600 seconds after said laser exposure (step b) and before said development (step c).

* * * * *